(12) United States Patent  
Hasegawa

(10) Patent No.: US 6,639,823 B2
(45) Date of Patent: Oct. 28, 2003

(54) FERROELECTRIC MEMORY DEVICE AND METHOD OF DRIVING THE SAME

(75) Inventor: Kazumasa Hasegawa, Fujimi-cho (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/026,874

(22) Filed: Dec. 27, 2001

(65) Prior Publication Data

US 2002/0145903 A1 Oct. 10, 2002

(30) Foreign Application Priority Data

Dec. 28, 2000 (JP) .......................... 2000-403226
Dec. 26, 2001 (JP) .......................... 2001-393928

(51) Int. Cl.⁷ .............................................. G11C 11/22
(52) U.S. Cl. .................. 365/145; 365/149; 365/185.03; 365/230.07; 365/65
(58) Field of Search ................. 365/145, 149, 365/185.03, 230.07, 65

(56) References Cited

U.S. PATENT DOCUMENTS

| | | | |
|---|---|---|---|
| 5,341,325 A | | 8/1994 | Nakano et al. ............. 365/145 |
| 5,487,032 A | * | 1/1996 | Mihara et al. .............. 365/145 |
| 5,579,257 A | * | 11/1996 | Tai ............................. 365/145 |
| 5,640,030 A | * | 6/1997 | Kenney ....................... 257/296 |
| 5,680,344 A | * | 10/1997 | Seyyedy ...................... 365/145 |
| 5,999,438 A | | 12/1999 | Ohsawa ....................... 365/145 |

FOREIGN PATENT DOCUMENTS

| | | |
|---|---|---|
| JP | A 6-60635 | 3/1994 |
| JP | A 7-122661 | 5/1995 |
| JP | A 8-180673 | 7/1996 |
| JP | A 10-312691 | 11/1998 |

* cited by examiner

Primary Examiner—David Nelms
Assistant Examiner—Connie C. Yoha
(74) Attorney, Agent, or Firm—Oliff & Berridge, PLC

(57) ABSTRACT

A ferroelectric memory device includes a memory cell array in which a plurality of memory cells having at least one ferroelectric capacitor are arranged. Three or more values of data (Pr(0), P1(1), and −Pr(2), for example) can be selectively stored in the ferroelectric capacitor by applying voltages having three or more different values for setting three or more polarization states in the ferroelectric capacitor.

4 Claims, 8 Drawing Sheets

FERROELECTRIC MEMORY DEVICE AND METHOD OF DRIVING THE SAME

Japanese Patent Application No. 2001-393928, filed on Dec. 26, 2001, is herein incorporated by reference in its entirety.

BACKGROUND OF THE INVENTION

The present invention relates to a ferroelectric memory device using ferroelectric capacitors in memory cells. More particularly, the present invention relates to a ferroelectric memory device capable of storing three or more values of data in one memory cell, and a method of driving the ferroelectric memory device.

In recent years, research and development of ferroelectric films such as PZT and SBT, ferroelectric capacitors using the ferroelectric films, and ferroelectric memory devices have been conducted extensively.

As a memory capable of storing multi-valued data, Japanese Patent Applications Laid-open No. 7-122661 and 8-180673 disclose memories in which a plurality of ferroelectric capacitors, for which the voltages required for polarization inversion differ, is connected in parallel and makes up one memory cell.

However, these technologies have the following problems. In the memory cells in which a plurality of ferroelectric capacitors for which the voltages required for polarization inversion differ is connected in parallel, the fabrication process is complicated when forming the ferroelectric capacitors for which the voltages required for polarization inversion differ, or the area occupied by a plurality of ferroelectric capacitors connected in parallel is increased, thereby increasing the cost of the ferroelectric memory device.

BRIEF SUMMARY OF THE INVENTION

The present invention may provide a ferroelectric memory device capable of storing multi-valued data consisting of three of more values per memory cell and a method of driving the same without causing the fabrication process to be complicated nor increasing an area occupied by ferroelectric capacitors.

The present invention provides a ferroelectric memory device having a memory cell array in which a plurality of memory cells each of which has at least one ferroelectric capacitor are arranged, wherein three or more values of data are selectively stored in the ferroelectric capacitor by applying voltages having three or more different values for setting three or more polarization states in the ferroelectric capacitor.

According to the present invention, three or more values of data can be stored by applying voltages having three or more different values for setting three or more polarization states in the ferroelectric capacitor, and by reading each of the polarization states as data. Each of the polarization states is set so that a sufficient margin which enables the data to be distinguished from each other at the time of reading is secured.

According to the present invention, since three or more values of data can be stored in the single ferroelectric capacitor, a higher degree of integration can be achieved without increasing the area occupied by the ferroelectric capacitors in comparison with a case of forming one memory cell by combining a plurality of ferroelectric capacitors.

Among the three or more polarization states, two polarization states may be saturation polarization states, and at least one polarization state may be a partial polarization state.

The present invention can be applied to the following ferroelectric memory devices, for example.

(A) Two-transistor, Two-capacitor (2T2C) Ferroelectric Memory Device

In this ferroelectric memory device, each of the memory cells may include one word line, two bit lines, one plate line, two transistors and two ferroelectric capacitors;

a gate of a first transistor may be connected to the word line, source/drains of the first transistor may be respectively connected to a first bit line and a first electrode of a first ferroelectric capacitor, and a second electrode of the first ferroelectric capacitor may be connected to the plate line; and a gate of a second transistor may be connected to the word line, source/drains of the second transistor may be respectively connected to a second bit line and a first electrode of a second ferroelectric capacitor, and a second electrode of the second ferroelectric capacitor may be connected to the plate line.

(B) One-transistor, One-capacitor (1T1C) Ferroelectric Memory Device

In this ferroelectric memory device, each of the memory cells may include one word line, one bit line, one plate line, one transistor and one ferroelectric capacitor; and a gate of the transistor may be connected to the word line, source/drains of the transistor may be respectively connected to the bit line and a first electrode of the ferroelectric capacitor, and a second electrode of the ferroelectric capacitor may be connected to the plate line.

(C) Simple Matrix Type Ferroelectric Memory Device

In this ferroelectric memory device, each of the memory cells may include one word line, one bit line, and one ferroelectric capacitor; and the word line and the bit line may be respectively connected to a first electrode and a second electrode of the ferroelectric capacitor.

According to the present invention, there is provided a first method of driving a ferroelectric memory device having a memory cell array in which a plurality of memory cells each of which has at least one ferroelectric capacitor are arranged, the method comprising:

a first step of applying a predetermined voltage to the ferroelectric capacitor in a memory cell selected from the plurality of memory cells to put the ferroelectric capacitor in a polarization state;

a second step of selectively writing three or more values of data in the ferroelectric capacitor of the selected memory cell by applying voltages having three or more different values for setting three or more polarization states in the ferroelectric capacitor; and a third step of applying a predetermined voltage to the ferroelectric capacitor in the selected memory cell to read out data based on variations in a polarization state of the ferroelectric capacitor.

The first method can be applied to the above-described ferroelectric memory devices in (B) and (C), for example.

According to the present invention, there is also provided a second method of driving the ferroelectric memory device described in (A), comprising:

a first step of applying a predetermined voltage to the first ferroelectric capacitor in a memory cell selected from the plurality of memory cells to put the first ferroelectric capacitor in a polarization state;

a second step of selectively writing three or more values of data in the first ferroelectric capacitor of the selected memory cell by applying voltages having three or more different values for setting three or more polarization states in the first ferroelectric capacitor, and also applying a predetermined voltage to the second ferroelectric capacitor to put the second ferroelectric capacitor in a polarization state; and a third step of applying a predetermined voltage to the first and second ferroelectric capacitors in the selected memory cell to read out data based on variations in a polarization state of the first and second ferroelectric capacitors.

In the first and second methods, the third step may serve as the first step for a following writing process, and a writing process which is the same as the writing process of the second step may be performed after the third step. In this case, the voltage applied to the ferroelectric capacitor in the third step may be the same as the voltage applied to the ferroelectric capacitor in the first step.

DETAILED DESCRIPTION OF THE EMBODIMENT

Embodiments of the present invention are described below with reference to the drawings.

First Embodiment

Figure 1:
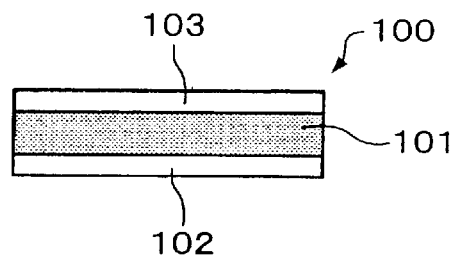
FIG. 1 is a cross-sectional view showing a ferroelectric capacitor according to one embodiment of the present invention.

FIG. 1 is a cross-sectional view showing a ferroelectric capacitor 100 according to a first embodiment of the present invention. In FIG. 1, 101 indicates a ferroelectric film, 102 indicates a lower electrode, and 103 indicates an upper electrode. In the ferroelectric capacitor 100, one of the upper electrode 103 and the lower electrode 102 is a first electrode, and the other is a second electrode. As the ferroelectric film 101, SBT ($SrBi_2Ta_2O_9$), PZT ($PbZr_{1-x}Ti_xO_3$), or other ferroelectric material may be used. The ferroelectric film 101 may be formed using a solution deposition process, CVD process, or the like. As materials for the lower electrode 102 and the upper electrode 103, noble metals such as platinum or iridium, other metal materials, oxides of these metals, a layered structure of these materials, and the like may be used. The upper electrode 103 and the lower electrode 102 may be formed using a sputtering process or the like.

Figure 2:
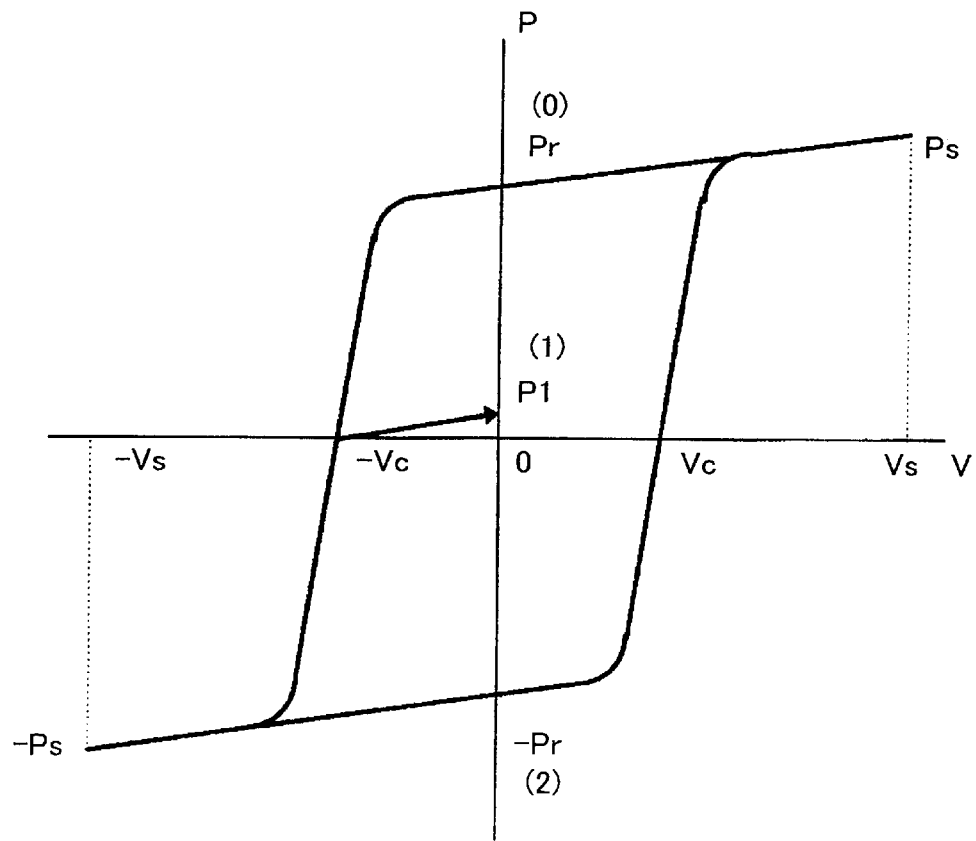
FIG. 2 is a graph showing a hysteresis curve of the ferroelectric capacitor according to one embodiment of the present invention.

FIG. 2 is a polarization (P)—voltage (V) graph showing a hysteresis curve for the ferroelectric capacitor 100 of FIG. 1. The features of the hysteresis curve of the ferroelectric capacitor 100 are described below. When a voltage Vs is applied to the ferroelectric capacitor 100, a polarization value Ps is produced. When the voltage value is reduced to 0, the polarization becomes a value of Pr. When the voltage is changed to −Vc, the polarization value is brought to approximately 0. When the voltage is changed to −Vs, a polarization value −Ps is produced. When the voltage value becomes 0 again, the polarization becomes a value of −Pr. When the voltage is changed to Vc, the polarization value becomes approximately 0. When a voltage Vs is applied, the polarization is returned to a value of Ps. A method of storing binary data in this ferroelectric capacitor, specifically, a method of storing two saturation polarization states at an applied voltage of 0 (polarization values Pr and −Pr) as binary data is generally known.

The following features have been confirmed by experiments conducted by the inventor. When a voltage Vs is applied before a voltage −V is applied (0>−V>−Vs), and then the voltage is returned to 0, the polarization has good reproducibility and is stable. In the case where a voltage −Vs is applied before a voltage V is applied (0<V<Vs), and then the voltage is returned to 0, the polarization also has good reproducibility and is stable. Specifically, in addition to the saturation polarization at an applied voltage of −Vs or Vs, a stable polarization state having good reproducibility can be obtained at an applied voltage of −V or V that are in a range between −Vs and Vs (hereinafter such polarization state is called "partial polarization"). If a margin which enables to distinguish data from other data in other polarization state at the time of reading, data assignment can be implemented. Therefore, multi-valued data including three or more values can be written into or read out from one ferroelectric capacitor by selecting three or more polarization states in which data can be assigned from the saturation and partial polarization states. This applies not only this embodiment of the present invention, but also to various other embodiment of the present invention.

When a voltage Vs is once applied to produce the polarization Ps before the reversal voltage −Vc is applied and then the voltage is reduced to 0 (0>−Vc>−Vs), for example, the hysteresis loop follows a locus indicated by an arrow, as shown in FIG. 2. At this time, the polarization can hold a stable value of P1. If the polarization value P1 can be distinguished from the saturation polarization values Pr and −Pr at the time of reading the data, the partial polarization state (polarization P1) can exist as a polarization state which can be stored in the ferroelectric capacitor in addition to the saturation polarization states (polarization values Pr and −Pr) Provided that a state in which the polarization value is Pr (first saturation polarization state) is defined as data "0", a state in which the polarization is at a value of P1 (partial polarization state) is defined as data "1", and a state in which the polarization value is −Pr (second saturation polarization state) is defined as data "2", three values of data can be stored.

Figure 7:
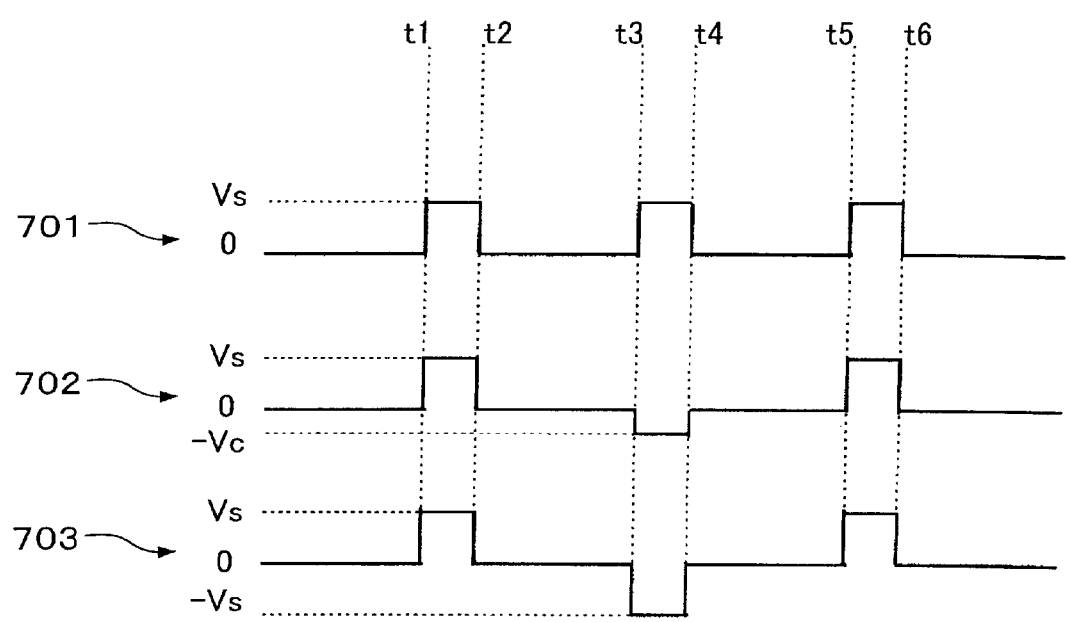
FIG. 7 is a diagram showing an example of waveforms of operating voltages for initialization, writing and reading of the ferroelectric capacitor according to one embodiment of the present invention.

FIG. 7 is a diagram showing an example of pulse waveforms of operating voltages for performing initialization, writing, and reading on the ferroelectric capacitor according to this embodiment. In FIG. 7, a waveform of an operating voltage for writing and reading in the data "0" is denoted by 701, a waveform of an operating voltage for writing and reading in the data "1" is denoted by 702, and a waveform of an operating voltage for writing and reading in the data "2" is denoted by 703.

As shown in FIG. 7, in a period between the time t1 and the time t2, a voltage Vs is applied to the ferroelectric capacitors in the selected memory cells, whereby the ferroelectric capacitors are initialized. In a period between the time t3 and the time t4, a voltage Vs is applied to the ferroelectric capacitor in the writing of the data "0", a voltage −Vc is applied to the ferroelectric capacitor in the writing of the data "1", and a voltage −Vs is applied to the ferroelectric capacitor in the writing of the data "2". In a period between the time t5 and the time 56, a voltage Vs is applied to the selected ferroelectric capacitors for data reading. The waveform of the voltage applied in the reading may serve as a waveform of the voltage for initialization applied in a period between t1 and t2.

Figure 8:
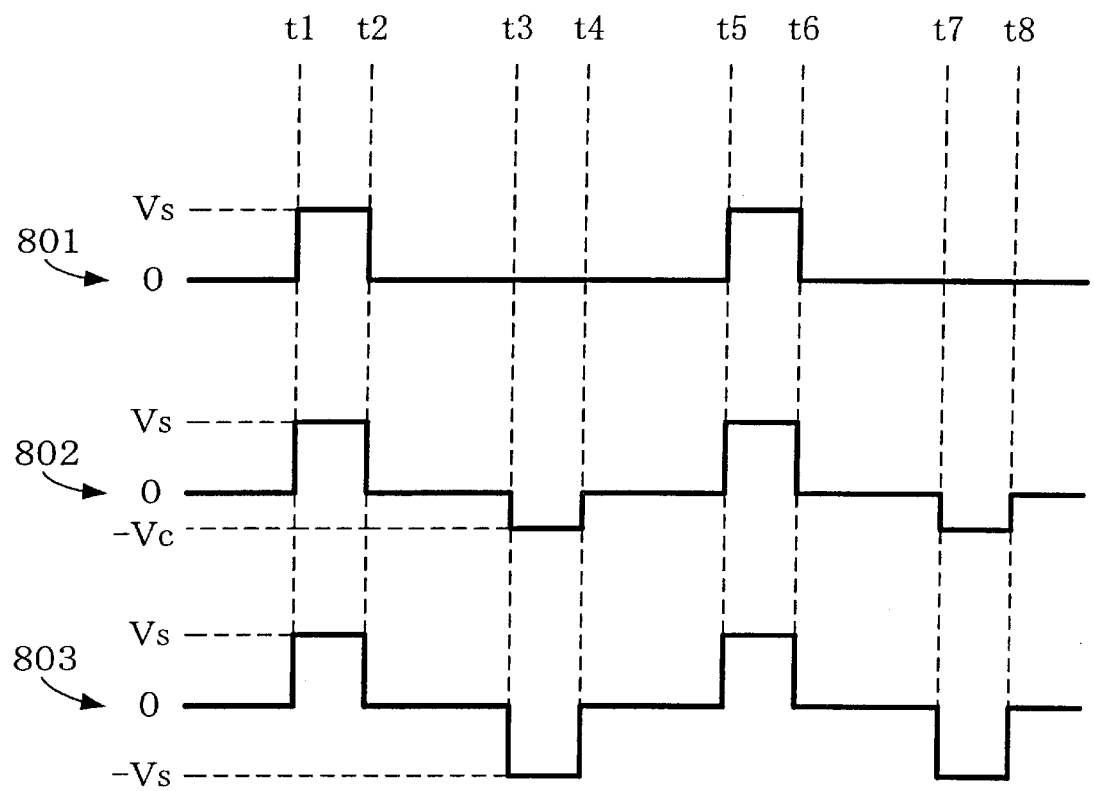
FIG. 8 is a diagram showing another example of waveforms of operating voltages for initialization, writing and reading of the ferroelectric capacitor according to one embodiment of the present invention.

FIG. 8 is a diagram showing an example of pulse waveforms of operating voltages for performing initialization, writing, and reading on the ferroelectric capacitor according to this embodiment. In FIG. 8, a waveform of an operating voltage for writing and reading in the state "0" is denoted by 801, a waveform of an operating voltage for writing and reading the data "1" is denoted by 802, and a waveform of an operating voltage for writing and reading the data "2" is denoted by 803.

In the example shown in FIG. 8, initialization in a period between t1 and t2 and reading in a period between t5 and t6 are the same as those of the example shown in FIG. 7. However, writing in a period between t3 and t4 differs from that of the example shown in FIG. 7. In this example, a voltage value of 0 is applied to the ferroelectric capacitor in the writing of the data "0", a voltage −Vc is applied to the ferroelectric capacitor in the writing of the data "1", and a voltage −Vs is applied to the ferroelectric capacitor in the writing of the data "2". The waveform of the voltage applied for reading is the same as a waveform of a voltage for initialization applied in a period between t1 and t2, and also serves as a waveform of a voltage for initialization applied in the rewriting in a period between the time t7 and the time t8.

As described above, in this embodiment of the present invention, various types of voltage waveforms may be employed for initialization, writing and reading on the ferroelectric capacitor. The polarity of the voltage waveforms may be the reverse of the examples shown in the drawings.

In this embodiment, three values of data can be stored in or read from one ferroelectric capacitor. The fabrication process of the ferroelectric memory device according to this embodiment is the same as that for conventional ferroelectric memory device which stores two values of data in one ferroelectric capacitor. An area required for one memory cell is also the same. Therefore, according to this embodiment of the present invention, the fabrication process can be easier and a higher degree of integration of memory cells can be achieved in comparison with the conventional ferroelectric memory devices which store multi-valued data.

Second Embodiment

Figure 3:
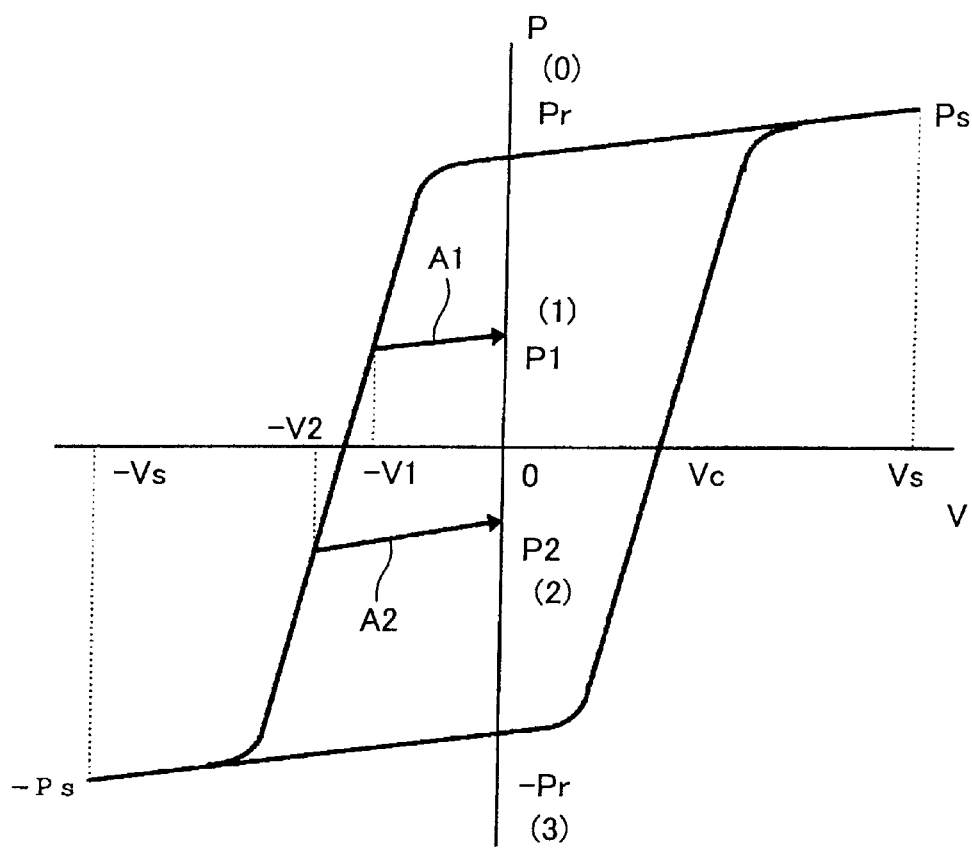
FIG. 3 is a graph showing another hysteresis loop of the ferroelectric capacitor according to one embodiment of the present invention.

FIG. 3 is a polarization (P)–voltage (V) graph showing a hysteresis curve of the ferroelectric capacitor 100 of FIG. 1. FIG. 3 shows an example of the hysteresis curve in the case where four values of data can be stored.

When a voltage Vs is applied to the ferroelectric capacitor to produce a polarization value Ps before a voltage −V1 is applied for writing and then the voltage is reduced to 0(0>−V1>−Vs), the hysteresis loop follows a locus indicated by an arrow A1, as shown in FIG. 3. At this time, the polarization holds a stable value of P1. When a voltage −V2 which is lower than the voltage −V1 but higher than a voltage −Vs is applied for writing before the voltage is reduced to 0, the hysteresis loop follows a locus indicated by an arrow A2. At this time, the polarization holds a stable value of P2. Specifically, if the saturation polarizations Pr and −Pr and the polarizations P1 and P2 can be distinguished from each other at the time of reading, the partial polarization states (polarization values P1 and P2) can exist as a polarization state which can be stored in the ferroelectric capacitor, in addition to the saturation polarization states (polarization values Pr and −Pr). A state in which the polarization value is Pr (first saturation polarization state) is defined as data "0", a state in which the polarization is at a value of P1 (first partial polarization state) is defined as data "1", a state in which the polarization is at a value of P2 (second partial polarization state) is defined as data "2", and a state in which the polarization value is −Pr (second saturation polarization state) is defined as data "3" in this embodiment. By setting voltages at the time of writing to four voltages (Vs, −V1, −V2, and −Vs), data "0", "1", "2" and "3" can be written into and read out. Therefore, according to this embodiment of the present invention, four values of data can be stored in or read out from one ferroelectric capacitor.

In this embodiment, the fabrication process is easier and a higher degree of integration of memory cells can be achieved in comparison with conventional ferroelectric memory devices which store multi-valued data in the same manner as in the first embodiment.

In the first and second embodiments, the data in the partial polarization state is written by applying a negative voltage. However, the same operation can be achieved if the potential is set to positive. The first and second embodiments describe multi-valued data consisting of three values or four values. However, multi-valued data consisting of five values or more may be stored.

Third Embodiment

Figure 4:
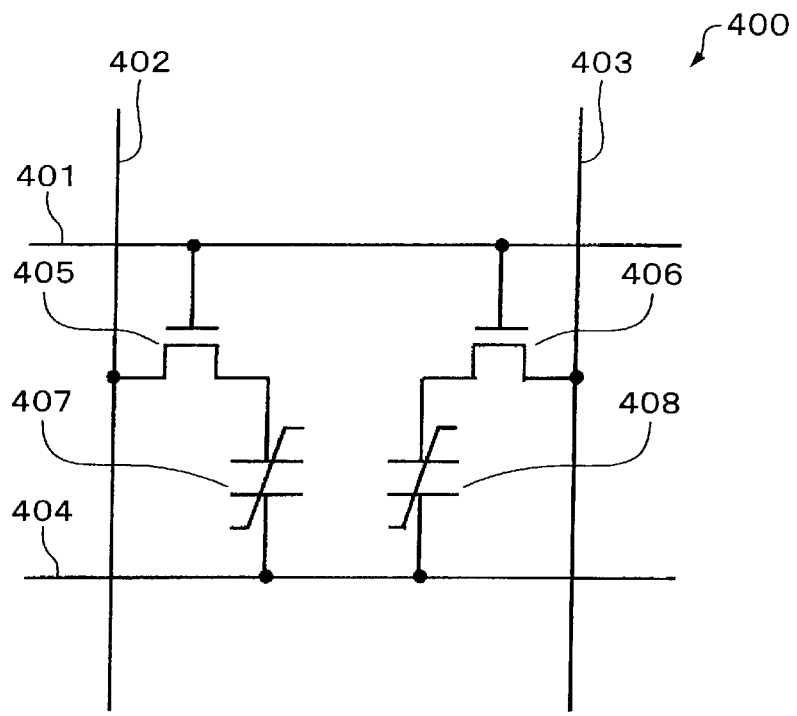
FIG. 4 is a diagram showing an equivalent circuit of a 2T2C type memory cell according to one embodiment of the present invention.

FIG. 4 is a diagram showing an equivalent circuit of a 2T2C memory cell 400 according to a third embodiment of the present invention. FIG. 4 shows the equivalent circuit of one memory cell, in which peripheral driver circuits, amplifier circuit for reading, and the like are omitted. In FIG. 4, 401 indicates a word line, 402 indicates a first bit line, 403 indicates a second bit line, 404 indicates a plate line, 405 indicates a first MOS transistor, 406 indicates a second MOS transistor, 407 indicates a first ferroelectric capacitor, and 408 indicates a second ferroelectric capacitor.

A gate of the first MOS transistor 405 is connected to the word line 401. Source/drains of the first MOS transistor 405 are connected to the first bit line 402 and a first electrode of the first ferroelectric capacitor 407, respectively. A second electrode of the first ferroelectric capacitor 407 is connected to the plate line 404. Source/drains of the second MOS transistor 406 are connected to the second bit line 403 and a first electrode of the second ferroelectric capacitor 408, respectively. A second electrode of the second ferroelectric capacitor 408 is connected to the plate line 404.

In the 2T2C memory cell 400, a predetermined voltage is applied to the first ferroelectric capacitor 407 in the selected memory cell, thereby causing the first ferroelectric capacitor 407 to be in a certain polarization state (initialized). One of three or more different voltages for setting three or more polarization states is then applied to the first ferroelectric capacitor 407, thereby selectively writing one of three or more values of data into the first ferroelectric capacitor 407. A predetermined voltage is applied to the second ferroelectric capacitor 408, thereby causing the second ferroelectric capacitor to be in a certain polarization state. A predetermined voltage is then applied to the first and second ferroelectric capacitors and the change of the polarization state of the first ferroelectric capacitor 407 and the change of the polarization state of the second ferroelectric capacitor 408 are detected as potentials. The data written into the first ferroelectric capacitor is read from the difference in potential between the first and second ferroelectric capacitors.

An example of the operation in this embodiment is described below.

Initialization

The potentials of the first bit line 402 and the second bit line 403 are set to 0. The first and second MOS transistors 405 and 406 are turned ON by driving the word line 401. A voltage −Vs is applied to the plate line 404, for example. At this time, a voltage Vs or a voltage close to the voltage Vs is applied to the first and second ferroelectric capacitors 407 and 408. As a result, the first and second ferroelectric capacitors 407 and 408 are initialized.

Writing

The first and second MOS transistors 405 and 406 are turned ON by driving the word line 401. One of three or more values of data is written into the first ferroelectric capacitor 407 through the first bit line 402. The data "0" is written into the second ferroelectric capacitor 408 through the second bit line 403, for example. The first and second MOS transistors 405 and 406 are then turned OFF, whereby the written data is held.

Reading

The potentials of the first bit line 402 and the second bit line 403 are set to 0. The first and second MOS transistors 405 and 406 are turned ON by driving the word line 401. A voltage −Vs is applied to the plate line 404, for example. At this time, a voltage Vs or a voltage close to the voltage Vs is applied to the first and second ferroelectric capacitors 407 and 408. As a result, predetermined data stored in advance is read from the first ferroelectric capacitor 407 through the first bit line 402. The data "0" stored in advance is read from the second ferroelectric capacitor 408 through the second bit line 403. The logic value of the data read through the first bit line 402 can be detected by comparing the potential of the first bit line 402 with the potential of the second bit line 403.

The fabrication process for the ferroelectric memory device using the 2T2C memory cells is the same as that for conventional ferroelectric memory devices which store binary information in one ferroelectric capacitor. In addition, the area per memory cell is also the same. Therefore, according to the ferroelectric memory device of this embodiment, since three or more values of data can be stored in one ferroelectric capacitor, the degree of integration and capacity of the memory cells can be increased.

The timing of causing the second ferroelectric capacitor 408 to be in a certain polarization state by applying a predetermined voltage to the second ferroelectric capacitor 408 may be the timing of initializing the first ferroelectric capacitor 407 by causing the ferroelectric capacitor 407 to be in a certain polarization state.

Fourth Embodiment

Figure 5:
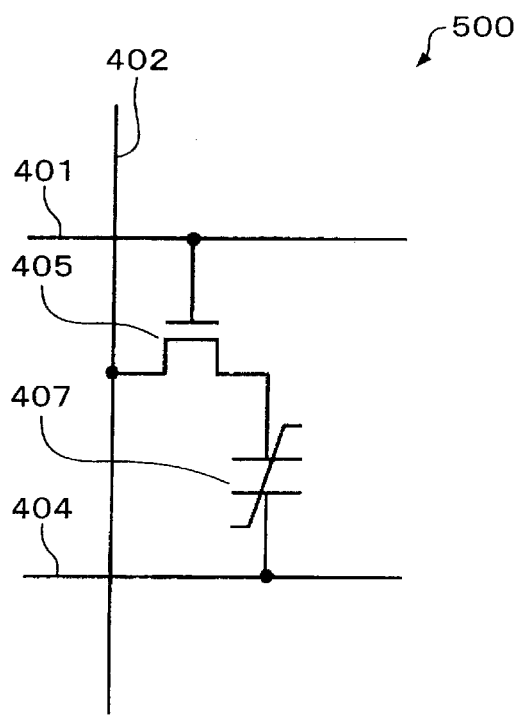
FIG. 5 is a diagram showing an equivalent circuit of a 1T1C type memory cell according to one embodiment of the present invention.

FIG. 5 is a diagram showing an equivalent circuit of a 1T1C memory cell 500 according to a fourth embodiment of the present invention. In FIG. 5, sections the same as those shown in FIG. 4 are indicated by the same symbols. In FIG. 5, peripheral driver circuits, amplifier circuit for reading, and the like are omitted.

The gate of the MOS transistor 405 is connected to the word line 401. The source/drains of the MOS transistor 405 are connected to the bit line 402 and the first electrode of the ferroelectric capacitor 407, respectively. The second electrode of the first ferroelectric capacitor 407 is connected to the plate line 404.

In the 1T1C memory cell 500, a predetermined voltage is applied to the ferroelectric capacitor 407 in the selected memory cell, thereby causing the ferroelectric capacitor 407 to be in a certain polarization state (initialized). One of three or more different voltages for setting three or more polarization states is applied to the ferroelectric capacitor 407 in the selected memory cell, thereby selectively writing one of three or more values of data into the ferroelectric capacitor 407. A predetermined voltage is then applied to the ferroelectric capacitor 407 and the change of the polarization state of the ferroelectric capacitor 407 in the selected memory cell is detected as a potential, whereby the data is read out.

An example of the operation in this embodiment is described below.

Initialization

The potential of the bit line 402 is set to 0. The MOS transistor 405 is turned ON by driving the word line 401. A voltage −Vs is applied to the plate line 404, for example. At this time, a voltage Vs or a voltage close to the voltage Vs is applied to the ferroelectric capacitor 407. As a result, the first ferroelectric capacitor 407 is initialized.

Writing

The MOS transistor 405 is turned ON by driving the word line 401. One of three or more values of data is written into the ferroelectric capacitor 407 through the first bit line 402. The MOS transistor 405 is then turned OFF, whereby the written data is held.

Reading

The potential of the bit line 402 is set to 0. The MOS transistor 405 is turned ON by driving the word line 401. A voltage −Vs is applied to the plate line 404, for example. At this time, a voltage Vs or a voltage close to the voltage Vs is applied to the ferroelectric capacitor 407. As a result, predetermined data stored in advance is read from the first ferroelectric capacitor 407 through the bit line 402. The logic value of the data read through the bit line 402 can be detected by processing this signal using a sense amplifier or the like.

In the case of using the 1T1C memory cell, since three or more values of data can be stored in one ferroelectric capacitor in the same manner as in other embodiments, the degree of integration and capacity of the memory cells can be increased.

Fifth Embodiment

Figure 6A:
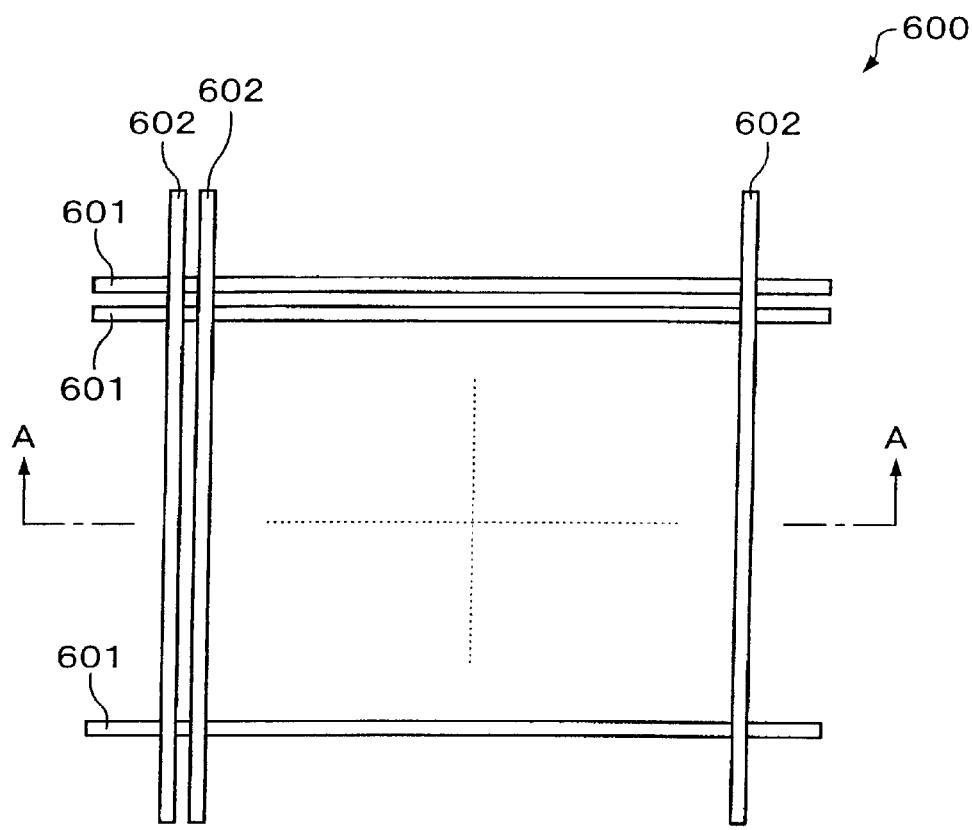
FIG. 6A is a plan view showing a ferroelectric memory device according to one embodiment of the present invention in which memory cells are arranged in a simple matrix.
Figure 6B:
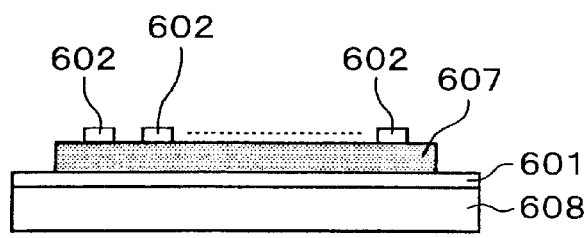
FIG. 6B is a cross-sectional view taken along the line A—A of FIG. 6A.

FIGS. 6A and 6B are views showing a ferroelectric memory device 600 having no transistor but a memory cell array in which memory cells are arranged in a simple matrix, according to a fifth embodiment of the present invention. In FIG. 6, peripheral driver circuits, amplifier circuit for reading, and the like are omitted. FIG. 6A is a plan view of the memory cell array, and FIG. 6B is a cross-sectional view taken along the line A—A of FIG. 6A. In FIG. 6A, 601 indicates a predetermined number of arranged word lines (only part of the word lines is illustrated), and 602 indicates a predetermined number of arranged bit lines (only part of the bit lines is illustrated).

The memory cell array is formed on a substrate 608, as shown in FIG. 6B. The wordlines 601, a ferroelectric film 607, and the bit lines 602 are layered on the substrate 608. The ferroelectric film 607 is disposed between the word lines 601 and the bit lines 602. Therefore, ferroelectric capacitors are formed at intersections between the word lines 601 and the bit lines 602. One of the word line and the bit line is a first electrode of the ferroelectric capacitor, and the other is a second electrode.

In the ferroelectric memory device 600 having a simple matrix type memory cell array, three or more values of data can be stored in or read from one ferroelectric capacitor by setting the write voltages applied to the ferroelectric capacitors formed at the intersections between the word lines and the bit lines to three or more voltages.

Experimental Example

Figure 9:
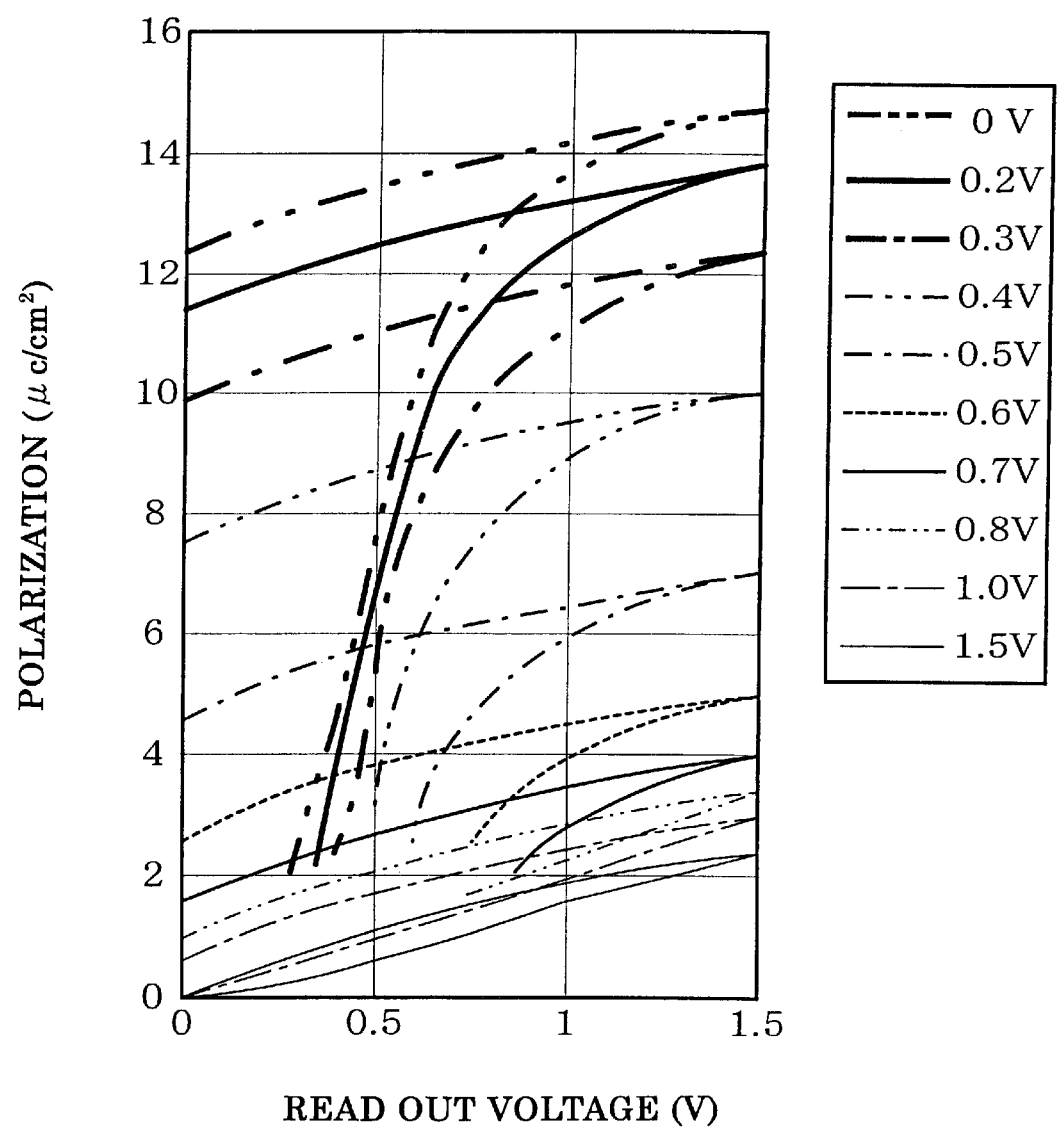
FIG. 9 is a graph showing the relationship between read out voltages and polarization values about various write voltages.
Figure 10:
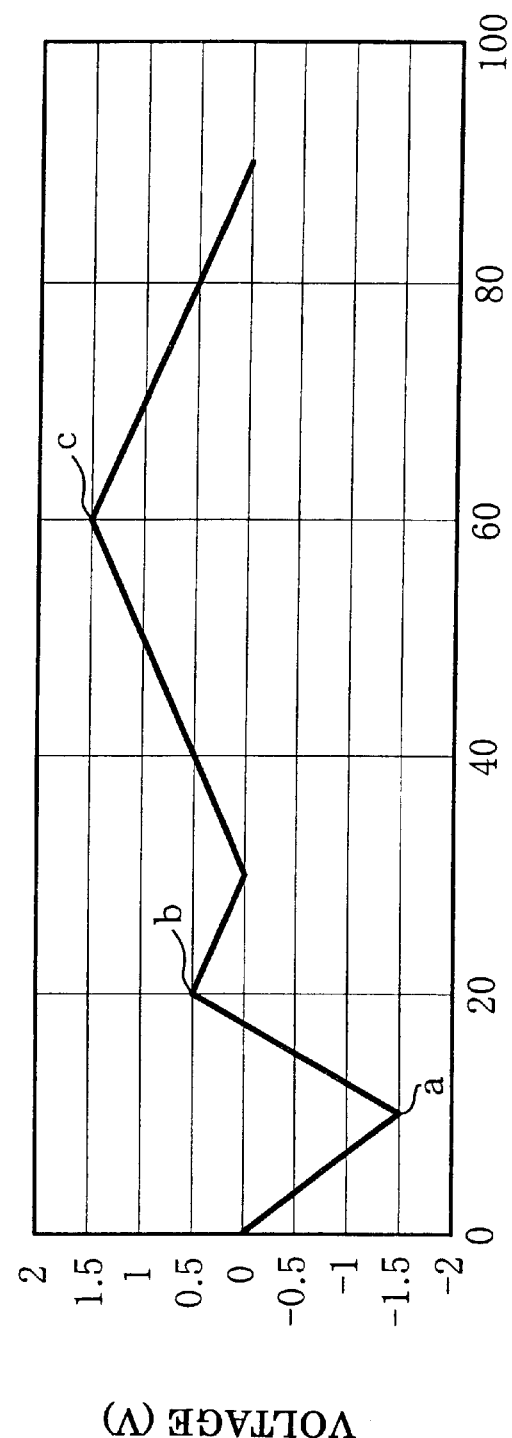
FIG. 10 is a graph showing a waveform of an operating voltage applied to the ferroelectric capacitor for measuring the polarization values shown in FIG. 9.

FIG. 9 is a graph showing results for measurement of polarization during the read operation corresponding to various levels of write voltages in the case of applying a voltage at an operating waveform shown in FIG. 10. In FIG. 9, voltages shown in the margin of the graph are write voltages (maximum value of triangular wave in FIG. 10). In FIG. 10, a triangular wave denoted by "a" shows an operating waveform for initialization, a triangular wave denoted by "b" shows an operating waveform for writing, and a triangular wave denoted by "c" shows an operating waveform for reading (from 0 V through 1.5 V to 0 V). FIG. 10 shows a case where the write voltage is 0.5 V.

In FIG. 9, in the case where the write voltage is set to 0 V, the change of the polarization at the time of reading becomes a maximum. In the case where the write voltage is set to 1.5 V, the change of the polarization at the time of reading becomes a minimum. When a voltage between 0 V and 1.5 V was applied as the write voltage, a stable hysteresis of which the polarization differs corresponding to the write voltage was obtained. As a result, it was confirmed that different read out polarizations can be obtained corresponding to different write voltages. This shows that multi-valued data consisting of three or more values can be written into or read from the ferroelectric capacitor by selecting the voltage applied to the ferroelectric capacitor. The multi-valued data can be written or read if the direction of the voltage in the initialization waveform and the direction of the voltage in the read out waveform are reversed. In the case of rewriting the data, after applying the initialization waveform, the write waveform is applied.

The embodiments of the present invention are described above. However, the present invention is not limited to these embodiments. Various modifications and variations are possible within the scope of the present invention.

What is claimed is:

1. A method of driving a ferroelectric memory device having a memory cell array in which a plurality of memory cells each of which has at least one ferroelectric capacitor are arranged, wherein three or more values of data are selectively stored in the ferroelectric capacitor by applying voltages having three or more different values for setting three or more polarization states in the ferroelectric capacitor;

wherein each of the memory cells includes one word line, two bit lines, one plate line, two transistors and two ferroelectric capacitors;

wherein a gate of a first transistor is connected to the word line, source/drains of the first transistor are respectively connected to a first bit line and a first electrode of a first ferroelectric capacitor, and a second electrode of a first ferroelectric capacitor is connected to the plate line; and wherein a gate of a second transistor is connected to the word line, source/drains of the second transistor are respectively connected to a second bit line and a first electrode of a second ferroelectric capacitor, and a second electrode of the second ferroelectric capacitor is connected to the plate line;

a first step of applying a first predetermined voltage to the first ferroelectric capacitor in a memory cell selected from the plurality of memory cells to put the first ferroelectric capacitor in a polarization state;

a second step of selectively writing three or more values of data in the first ferroelectric capacitor of the selected memory cell by applying voltages having three or more different values for setting three or more polarization states in the first ferroelectric capacitor, and also applying a second predetermined voltage to the second ferroelectric capacitor to put the second ferroelectric capacitor in a polarization state; and a third step of applying a third predetermined voltage to the first and second ferroelectric capacitors in the selected memory cell to read out data based on variations in a polarization state of the first and second ferroelectric capacitors.

2. The method of driving a ferroelectric memory device as defined in claim 1, wherein the third step serves as the first step for a following writing process; and wherein a writing process which is the same as the writing process of the second step is performed after the third step.

3. The method of driving a ferroelectric memory device as defined in claim 2, wherein the third predetermined voltage applied to the first and second ferroelectric capacitors in the third step is the same as the first predetermined voltage applied to the first ferroelectric capacitor in the first step.

4. The method of driving a ferroelectric memory device as defined in claim 1, wherein at least one polarization state among the three or more polarization states is a partial polarization state.

* * * * *